(12) United States Patent
Hu (10) Patent No.: US 9,525,403 B2
(45) Date of Patent: Dec. 20, 2016

(54) CLOCK FREQUENCY MODULATION METHOD AND CLOCK FREQUENCY MODULATION APPARATUS

(71) Applicant: Huawei Technologies Co., Ltd., Shenzhen (CN)

(72) Inventor: Minjie Hu, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 2 days.

(21) Appl. No.: 14/693,522

(22) Filed: Apr. 22, 2015

(65) Prior Publication Data

US 2015/0311888 A1 Oct. 29, 2015

(30) Foreign Application Priority Data

Apr. 24, 2014 (CN) .......................... 2014 1 0168292

(51) Int. Cl.
*H03K 21/00* (2006.01)
*H03K 23/00* (2006.01)
(Continued)

(52) U.S. Cl.
CPC ............. *H03K 5/00006* (2013.01); *G06F 1/10* (2013.01); *G06F 1/189* (2013.01); *H03K 19/00346* (2013.01); *H03K 21/00* (2013.01)

(58) Field of Classification Search
USPC .............. 327/2–12, 105–123, 141, 144–163; 331/15–17; 375/373–376
See application file for complete search history.

(56) References Cited

U.S. PATENT DOCUMENTS

| | | | |
|---|---|---|---|
| 4,849,703 A | 7/1989 | Easley et al. | |
| 6,397,048 B1 * | 5/2002 | Toda | H03H 17/0621 375/316 |

(Continued)

FOREIGN PATENT DOCUMENTS

| | | |
|---|---|---|
| CN | 1510861 A | 7/2004 |
| CN | 101546206 A | 9/2009 |

(Continued)

OTHER PUBLICATIONS

Mögel et al., "EMI Performance of Spread Spectrum Clock Signals with respect to the IF Bandwidth of the EMC Standard," Proceedings of the 2005 European Conference on Circuit Theory and Design, vol. 1, Institute of Electrical and Electronics Engineers, New York, New York (Aug. 28-Sep. 2, 2005).

*Primary Examiner* — Brandon S Cole
(74) *Attorney, Agent, or Firm* — Leydig, Voit & Mayer, Ltd.

(57) ABSTRACT

Embodiments of the present invention provide a clock frequency modulation method and a clock frequency modulation apparatus. The method includes: determining N digital clocks according to a first digital clock of a system, where the N digital clocks includes a second digital clock and N-1 digital clocks except the second digital clock, and a sum of frequency ratios of the first digital clock to each of the N-1 digital clocks is equal to N-1 times a frequency ratio of the first digital clock to the second digital clock, where N is an integer greater than 2; and fitting, during a modulation period by using the N digital clocks, the first digital clock into the periodic second digital clock. The embodiments of the present invention use a clock frequency modulation technology to make energy concentrated in a frequency spread to a wider frequency range.

14 Claims, 7 Drawing Sheets (51) Int. Cl.

| | |
|---|---|
| *H03K 25/00* | (2006.01) |
| *H03K 5/00* | (2006.01) |
| *G06F 1/10* | (2006.01) |
| *G06F 1/18* | (2006.01) |
| *H03K 19/003* | (2006.01) |

(56) References Cited

U.S. PATENT DOCUMENTS

| | | | | |
|---|---|---|---|---|
| 6,433,643 B1* | 8/2002 | Opsahl | ................ | H03L 7/1976 331/1 A |
| 7,010,287 B2* | 3/2006 | Oh | ................ | H03B 27/00 327/113 |
| 7,208,990 B1* | 4/2007 | Hassun | ................ | H03L 7/1806 327/156 |
| 2005/0216780 A1* | 9/2005 | Sung | ................ | G06F 1/04 713/500 |
| 2006/0170465 A1* | 8/2006 | Kelley | ................ | H03D 7/00 327/122 |
| 2011/0074469 A1 | 3/2011 | Rapinoja et al. | | |
| 2012/0081156 A1* | 4/2012 | Hesen | ................ | H03K 21/12 327/115 |
| 2013/0301754 A1 | 11/2013 | Staszewski et al. | | |
| 2015/0311888 A1* | 10/2015 | Hu | ................ | G06F 1/10 327/115 |

FOREIGN PATENT DOCUMENTS

| | | | |
|---|---|---|---|
| CN | 101807913 A | | 8/2010 |
| CN | 102447472 A | | 5/2012 |
| WO | WO 03067379 A2 | | 8/2003 |
| WO | WO 2005078608 A2 | | 8/2005 |

* cited by examiner

CLOCK FREQUENCY MODULATION METHOD AND CLOCK FREQUENCY MODULATION APPARATUS

CROSS-REFERENCE TO RELATED APPLICATION

This application claims priority to Chinese Patent Application No. 201410168292.X, filed on Apr. 24, 2014, which is hereby incorporated by reference in its entirety.

TECHNICAL FIELD

The present invention relates to the communications field, and more specifically, to a clock frequency modulation method and a clock frequency modulation apparatus.

BACKGROUND

To meet the development trend of a radio base station toward miniaturization, low costs and low power consumption, a radio-on-chip (ROC, Radio on Chip) has been developed. The ROC integrates a digital circuit and a radio frequency (RF, Radio Frequency) circuit into a single chip, so as to greatly reduce an area of a board and cost of a base station, and further minimize power consumption so as to meet the trend of Power over Ethernet (PoE, Power over Ethernet).

However, the ROC introduces a new problem, that is, interference of the digital circuit on the RF circuit. In the conventional ROC, when the digital circuit uses a single-phase clock, a relatively large charge/discharge current exists because the digital circuit in the ROC basically turns over near a rising edge of the clock. Consequently, a high-energy interfering pulse signal is generated near the rising edge. Because a radio frequency has dozens of frequency bands, and no matter which clock frequency is selected, an interfering pulse signal or a harmonic derived from the interfering pulse signal may fall within some radio frequency bands, thereby resulting in worsening of receiving sensitivity, saturation of a receiving ADC, or deterioration of an EVM of a signal, so that an indicator requirement in a protocol cannot be met. In view of this, how to avoid interference of the digital circuit on the RF circuit is very important for ensuring performance of the ROC.

SUMMARY

Embodiments of the present invention propose a clock frequency modulation method and a clock frequency modulation apparatus used in digital-analog interference suppression, so as to solve a problem of how to adjust clock frequency to achieve effective digital-analog interference suppression.

According to a first aspect, a clock frequency modulation method is provided, including: determining N digital clocks according to a first digital clock of a system, where the N digital clocks include a second digital clock and N-1 digital clocks except the second digital clock, and a sum of a frequency ratio of the first digital clock to each of the N-1 digital clocks is equal to N-1 times a frequency ratio of the first digital clock to the second digital clock, where N is an integer greater than 2; and fitting, during a modulation period by using the N digital clocks, the first digital clock into the periodic second digital clock.

With reference to the first aspect, in a first implementation manner of the first aspect, the N digital clocks are separately integer frequency dividing clocks of the first digital clock, and frequency dividing coefficients of the N digital clocks are different from each other.

With reference to the first aspect or the first implementation manner of the first aspect, in a second implementation manner of the first aspect, the fitting, during a modulation period by using the N digital clocks, the first digital clock into the periodic second digital clock includes: mapping, during the modulation period, the N digital clocks separately to a pseudo-random noise PN sequence with a length of M, so as to randomize frequency jitter of the N digital clocks, where a probability that each of the N digital clocks appears in the modulation period is equal, a cyclic period of the PN sequence is equal to the modulation period, N is less than or equal to $2^M$, and M is a positive integer; and fitting, during the modulation period by using the N digital clocks mapped to the PN sequence, the first digital clock into the periodic second digital clock.

With reference to the second implementation manner of the first aspect, in a third implementation manner of the first aspect, the mapping the N digital clocks separately to a pseudo-random noise PN sequence with a length of M includes: mapping, when N is equal to $2^M$, the N-1 digital clocks to $2^M-1$ cyclic states of the PN sequence in a one-to-one manner; and mapping the second digital clock to a dead state of the PN sequence, where the dead state is a PN code whose M bits are all 0s, and other PN codes are the cyclic states.

With reference to the second implementation manner of the first aspect, in a fourth implementation manner of the first aspect, the mapping the N digital clocks separately to a pseudo-random noise PN sequence with a length of M includes: selecting, when N is equal to $2^L$ and L is a positive integer less than M, L bits from M bits of the PN sequence; mapping the second digital clock to a PN code, which is in the PN sequence, with the L bits whose numerical values are all 0; and mapping the N-1 digital clocks to other PN codes of the PN sequence, where any of the digital clocks is separately mapped to a plurality of PN codes with the L bits whose numerical values are the same.

With reference to the first aspect and the first to the fourth implementation manners, in a fifth implementation manner of the first aspect, before determining the N digital clocks according to the first digital clock of the system, the method further includes: performing first first-in first-out (FIFO) buffering on the first digital clock; and performing second FIFO buffering on the N digital clocks after fitting, by using the N digital clocks, the first digital clock into the periodic second digital clock, where the second FIFO buffering is synchronous with the first FIFO buffering, so that the N digital clocks after modulation have no delay jitter.

According to a second aspect, a clock frequency modulation apparatus is provided, including: a determining unit, configured to determine N digital clocks according to a first digital clock of a system, where the N digital clocks include a second digital clock and N-1 digital clocks except the second digital clock, and a sum of a frequency ratio of the first digital clock to each of the N-1 digital clocks is equal to N-1 times a frequency ratio of the first digital clock to the second digital clock, where N is an integer greater than 2; and a modulation unit, configured to fit, during a modulation period by using the N digital clocks, the first digital clock into the periodic second digital clock.

With reference to the second aspect, in a first implementation manner of the second aspect, the N digital clocks are separately integer frequency dividing clocks of the first digital clock, and frequency dividing coefficients of the N digital clocks are different from each other.

With reference to the second aspect or the first implementation manner of the second aspect, in a second implementation manner of the second aspect, the modulation unit includes: a mapping subunit, configured to map, during the modulation period, the N digital clocks separately to a pseudo-random noise PN sequence with a length of M, so as to randomize frequency jitter of the N digital clocks, where a probability that each of the N digital clocks appears in the modulation period is equal, a cyclic period of the PN sequence is equal to the modulation period, N is less than or equal to $2^M$, and M is a positive integer; and a fitting subunit, configured to fit, during the modulation period by using the N digital clocks mapped to the PN sequence, the periodic first digital clock into the periodic second digital clock.

With reference to the second implementation manner of the second aspect, in a third implementation manner of the second aspect, the mapping subunit is specifically configured to: when N is equal to $2^M$, map the N-1 digital clocks to $2^M$-1 cyclic states of the PN sequence in a one-to-one manner, and map the second digital clock to a dead state of the PN sequence, where the dead state is a PN code whose M bits are all 0s, and other PN codes are the cyclic states.

With reference to the second implementation manner of the second aspect, in a fourth implementation manner of the second aspect, the mapping subunit is specifically configured to: when N is equal to $2^L$ and L is a positive integer less than M, select L bits from M bits of the PN sequence, map the second digital clock to a PN code, which is in the PN sequence, with the L bits whose numerical values are all 0s, and map the N-1 digital clocks to the remaining PN code of the PN sequence, where any of the digital clocks is separately mapped to a plurality of PN codes with the L bits whose numerical values are the same.

With reference to the second aspect and the first to the fourth implementation manners, the apparatus further includes: a first FIFO buffer, connected to the determining unit and configured to perform first FIFO buffering on the first digital clock before the first digital clock is input to the determining unit; and a second FIFO buffer, connected to the modulation unit and configured to perform second FIFO buffering on the N digital clocks output by the modulation unit; where the second FIFO buffering is synchronous with the first FIFO buffering, so that the N digital clocks after modulation have no delay jitter.

In the embodiments of the present invention, a clock frequency modulation technology (such as clock spread spectrum) is used to spread energy concentrated on a frequency to a relatively wide frequency range, so as to reduce energy of digital interference in a frequency domain and achieve digital-analog interference suppression.

BRIEF DESCRIPTION OF DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

For a RF circuit of a radio base station, if an interfering signal or a harmonic derived from the interfering signal falls within a band of a radio frequency signal (in particular, energy of a received signal is usually very small), resulting in worsening of receiving sensitivity of the RF circuit, saturation of a receiving analog to digital converter (ADC, Analog to Digital Converter), or deterioration of an error vector magnitude (EVM, Error Vector Magnitude) of a signal evaluation module, so that an indicator requirement in a protocol cannot be met.

It is easy to understand that there are generally dozens of radio frequency bands, and no matter which kind of digital clock frequency is selected, an interfering harmonic of a digital clock may fall within a radio frequency band.

Generally, a clock frequency of a digital circuit of a ROC is fixed, and an introduced interference is a high-energy monophonic signal. If the clock frequency of the digital circuit jitters randomly within a specific range, the clock frequency is changed from a monophonic signal to a broadband signal.

When power consumption of the digital circuit is a fixed value, interfering energy of the broadband signal is greatly reduced compared with interfering energy of the monophonic signal. In addition, if the clock frequency is a monophonic signal, generally, interference is also a monophonic signal; if the clock frequency is a broadband signal, the interference is a broadband signal, and as a quantity of times of the interfering harmonic increases, a bandwidth of the interfering signal becomes wider, and interfering energy becomes lower. After using clock frequency modulation, an interfering harmonic of order-n extends very wide, so that most interfering energy falls outside a band of an effective communication signal. Furthermore, an interference suppression effect of a high frequency band is better than an interference suppression effect of a low frequency band.

Figure 1:
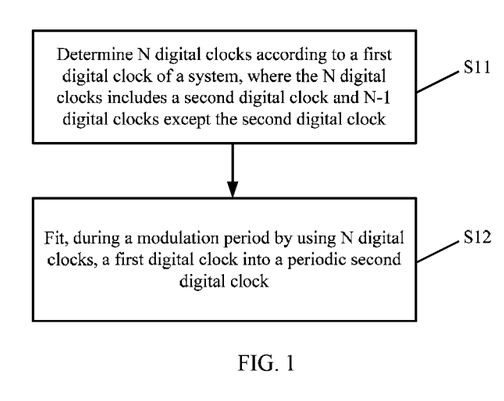
FIG. 1 is a flowchart of a clock frequency modulation method according to an embodiment of the present invention.

FIG. 1 shows a clock frequency modulation method according to an embodiment of the present invention.

S11. Determine N digital clocks according to a first digital clock of a system, where the N digital clocks include a second digital clock and N-1 digital clocks except the second digital clock, and a sum of frequency ratios of the first digital clock to each of the N-1 digital clocks is equal to N-1 times a frequency ratio of the first digital clock to the second digital clock, where N is an integer greater than 2.

S12. Fit, during a modulation period by using the N digital clocks, the first digital clock into the periodic second digital clock.

In this embodiment of the present invention, a clock frequency modulation technology (that is, clock spread spectrum) is used to spread energy concentrated on a frequency to a relatively wide frequency range, so as to reduce energy of digital interference in a frequency domain and achieve digital-analog interference suppression.

The second digital clock may be called a center-point digital clock of the system, which represents a digital clock that is expected to be obtained through fitting by means of clock frequency modulation processing, and may also be called "a pre-modulation digital clock" or "a digital clock in a non-modulation domain" in this embodiment of the present invention.

Optionally, as an implementation manner, the first digital clock may be a current phase locked loop (PLL, Phase Locked Loop) output clock of the system. However, a specific type of the digital clock is not limited in this embodiment of the present invention, and the digital clock may also be another digital clock of the system.

Optionally, as another implementation manner, the N digital clocks may separately be integer frequency dividing clocks of the first digital clock, and frequency dividing coefficients of the N digital clocks are different from each other.

Optionally, as another implementation manner, in S12, the N digital clocks may be separately mapped to a pseudo-random noise (PN, Pseudo-random Noise) sequence with a length of M during the modulation period, so as to randomize frequency jitter of the N digital clocks, where a probability that each of the N digital clocks appears in the modulation period is equal, a cyclic period of the PN sequence is equal to the modulation period, N is less than or equal to $2^M$, and M is a positive integer. Then, the first digital clock may be fitted, during the modulation period by using the N digital clocks mapped to the PN sequence, into the periodic second digital clock.

Optionally, as another implementation manner, when N is equal to $2^M$, the N-1 digital clocks may be mapped to $2^M-1$ cyclic states of the PN sequence in a one-to-one manner, and the second digital clock may be mapped to a dead state of the PN sequence, where the dead state is a PN code whose M bits are all 0s, and other PN codes are the cyclic states.

Optionally, as another implementation manner, when N is equal to $2^L$ and L is a positive integer less than M, L bits may be selected from M bits of the PN sequence, the second digital clock is mapped to a PN code, which is in the PN sequence, with the L bits whose numerical values are all 0s, and the N-1 digital clocks are mapped to other PN codes of the PN sequence, where any of the digital clocks is separately mapped to a plurality of PN codes with the L bits whose numerical values are the same.

In this way, if an interfering harmonic is an order-n interfering harmonic of the N digital clocks, a bandwidth of the order-n interfering harmonic is n times a bandwidth of the N modulated digital clocks, so that interfering energy of the interfering harmonic is greatly reduced.

It should be understood that the modulation period may be equal to a cyclic period of the PN sequence, and the modulation period may also be called a random seed period.

Figure 2:
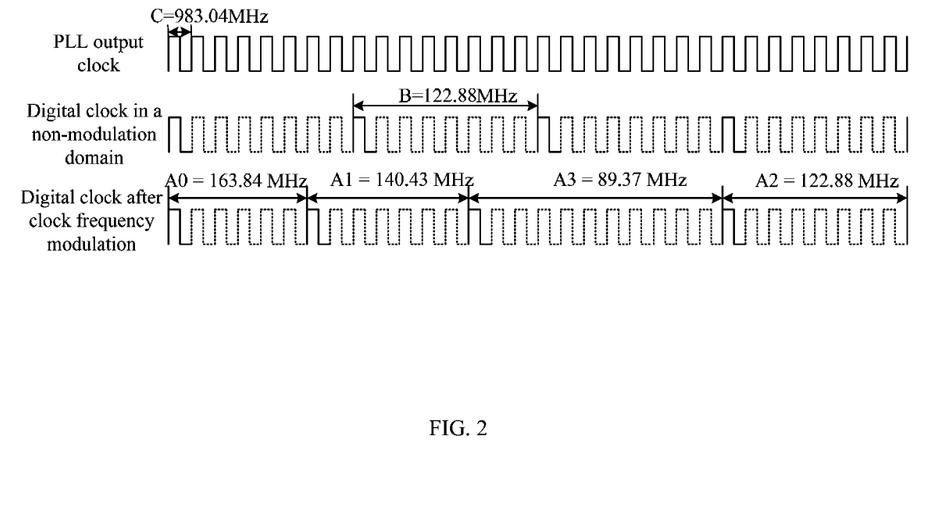
FIG. 2 shows a schematic diagram of periodic frequency fitting in a specific embodiment of the present invention.

The following describes, in more details with reference to a specific example of FIG. 2, how to select a discrete frequency used for clock frequency modulation and how to implement periodic frequency fitting in this embodiment of the present invention. It should be noted that a specific numerical value in the specific example in FIG. 2 is just exemplary, and does not limit the scope of the present invention.

Assuming that the first digital clock is a PLL output clock and its frequency C is 983.04 MHz, and that a frequency B, which is expected to be obtained, of the second digital clock (which may be called "a pre-modulation digital clock" or "a digital clock in a non-modulation domain") is 122.88 MHz.

Four frequencies 163.84 MHz (which is a frequency obtained by dividing 983.04 MHz by 6 and is marked A0), 140.43 MHz (which is a frequency obtained by dividing 983.04 MHz by 7 and is marked A1), 122.88 MHz (which is a frequency obtained by dividing 983.04 MHz by 8 and is marked A2), and 89.37 MHz (which is a frequency obtained by dividing 983.04 MHz by 11 and is marked A3) may be selected, where A2=B. As can be seen from FIG. 2, as long as it is ensured that probabilities that digital clocks, which are modulated using the three frequencies 163.84 MHz, 140.43 MHz, and 89.37 MHz, appear are the same, periodic frequency fitting with the frequency 122.88 MHz (marked B) of the center-point digital clock can be achieved.

Herein, a sequence of the four types of digital clocks A0-A3 shown in FIG. 2 is just exemplary, this embodiment of the present invention does not set a limitation to a manner of sorting the digital clocks, and it is only required that a probability that each digital clock except the second digital clock B appears is equal. The digital clocks may be randomly arranged, or may be arranged in a particular order. These changes all fall within the scope of the present invention.

To achieve periodic frequency fitting, reference may be made to the following principles in selecting a frequency for clock frequency modulation:

1) A highest clock frequency (which is 163.84 MHz in this embodiment) meets a timing convergence constraint, so that each designed timing indicator can meet a requirement formulated before designing;

2) It is preferable that a quantity of selected digital clock frequencies is a power of 2, and one of the frequencies is a frequency (which is 122.88 MHz in this embodiment) of the pre-modulation digital clock. In this way, it is convenient to select a PN sequence, which will be described in detail in the following content; and 3) Assuming that a sequence of the selected digital clock frequencies is {A0, A1, . . . , AN}, a frequency of the center-point digital clock is B (where B is one of {A0, A1, . . . , AN}), and a frequency of the first digital clock is C. The periodic frequency fitting means that C/A0+C/A1+ . . . +C/AN=N*(C/B) is met.

In this embodiment of the present invention, low-frequency digital clocks with a plurality of frequencies are generated by dividing a frequency of a high-frequency digital clock, and an output clock is randomly selected from these low frequency digital clocks. In addition, by selecting a proper random seed and a proper clock frequency, periodic frequency fitting of clock frequencies can be achieved within one period (which is generally a random seed period), that is, a digital circuit does not sense jitter or a change in clock frequencies in a specific period. For a specific embodiment of FIG. 2, increasing randomicity of four frequencies 163.84 MHz (which is a frequency obtained by dividing 983.04 MHz by 6), 140.43 MHz (which is a frequency obtained by dividing 983.04 MHz by 7), 122.88 MHz (which is a frequency obtained by dividing 983.04 MHz by 8), and 89.37 MHz (which is a frequency obtained by dividing 983.04 MHz by 11) indicates that jitter or a change in a clock period in a specific period is less apparent.

In addition, under some conditions, clock frequency jitter may cause signal delay jitter and an error in interconnection between non-modulation clock domains. To further solve this problem, before N digital clocks are determined according to a current first digital clock, and after the first digital clock is separately modulated onto the N digital clocks and is output, first-in first-out (FIFO, First In First Out) processing is separately performed. Specifically, as another embodiment, before S11, first FIFO buffering may be performed on the first digital clock; and after S12, second FIFO buffering may be performed on the N digital clocks, where the second FIFO buffering is synchronous with the first FIFO buffering, so that the N digital clocks have no delay jitter after modulation.

Figure 3:
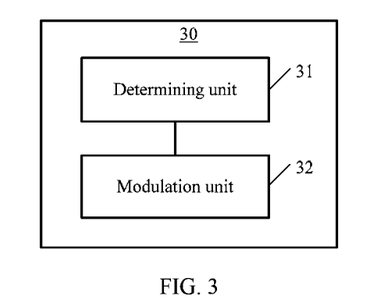
FIG. 3 is a schematic structural diagram of a clock frequency modulation apparatus according to an embodiment of the present invention.

The following describes, in detail with reference to FIG. 3, a clock frequency modulation apparatus according to an embodiment of the present invention. A clock frequency modulation apparatus 30 includes a determining unit 31 and a modulation unit 32.

The determining unit 31 is configured to determine N digital clocks according to a first digital clock of a system, where the N digital clocks include a second digital clock and N-1 digital clocks except the second digital clock, and a sum of frequency ratios of the first digital clock to each of the N-1 digital clocks is equal to N-1 times a frequency ratio of the first digital clock to the second digital clock, where N is an integer greater than 2.

The modulation unit 32 is configured to fit, during a modulation period by using the N digital clocks, the first digital clock into the periodic second digital clock.

In this embodiment of the present invention, a clock frequency modulation technology (that is, clock spread spectrum) is used to spread energy concentrated on a frequency to a relatively wide frequency range, so as to reduce energy of digital interference in a frequency domain and achieve digital-analog interference suppression.

The second digital clock may be called a center-point digital clock of the system, which represents a digital clock that is expected to be obtained through fitting by means of clock frequency modulation processing, and may also be called "a pre-modulation digital clock" or "a digital clock in a non-modulation domain" in this embodiment of the present invention.

Optionally, as an embodiment, the first digital clock may be a current phase locked loop (PLL, Phase Locked Loop) output clock of the system. However, a specific type of the digital clock is not limited in this embodiment of the present invention, and the digital clock may also be another digital clock of the system.

Optionally, as another embodiment, the N digital clocks may separately be integer frequency dividing clocks of the first digital clock, and frequency dividing coefficients of the N digital clocks are different from each other.

Figure 4:
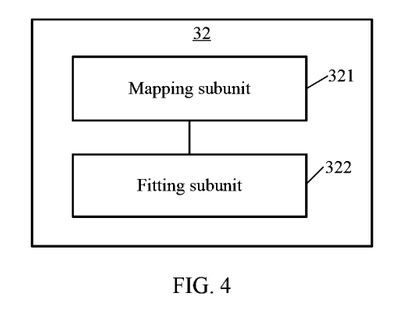
FIG. 4 is a schematic structural diagram of a modulation unit in a clock frequency modulation apparatus according to an embodiment of the present invention.

Optionally, as another embodiment, the modulation unit 32 may include a mapping subunit 321 and a fitting subunit 322, as shown in FIG. 4.

The mapping subunit 321 is configured to separately map the N digital clocks to a pseudo-random noise PN sequence with a length of M during the modulation period, so as to randomize frequency jitter of the N digital clocks, where a probability that each of the N digital clocks appears in the modulation period is equal, a cyclic period of the PN sequence is equal to the modulation period, N is less than or equal to $2^M$, and M is a positive integer.

The fitting subunit 322 is configured to fit, during the modulation period by using the N digital clocks mapped to the PN sequence, the periodic first digital clock into the periodic second digital clock.

Optionally, as another embodiment, when N is equal to $2^M$, the mapping subunit 321 may be configured to map the N-1 digital clocks to $2^M$-1 cyclic states of the PN sequence in a one-to-one manner, and map the second digital clock to a dead state of the PN sequence, where the dead state is a PN code whose M bits are all 0s, and other PN codes are the cyclic states.

Optionally, as another embodiment, the mapping subunit 321 may be configured to, when N is equal to $2^L$ and L is a positive integer less than M, select L bits from M bits of the PN sequence, the second digital clock is mapped to a PN code, which is in the PN sequence, with the L bits whose numerical values are all 0s, and the N-1 clock frequencies are mapped to other PN codes of the PN sequence, where any of the digital clocks is separately mapped to a plurality of PN codes with the L bits whose numerical values are the same.

Figure 5:
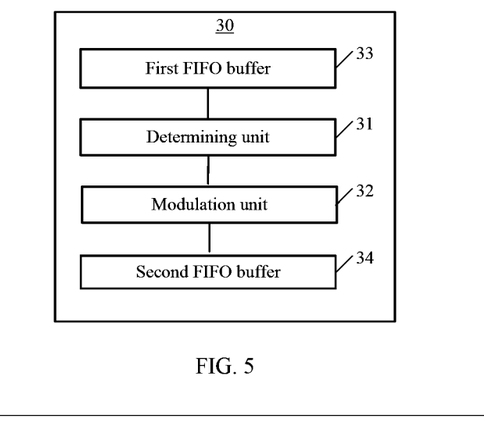
FIG. 5 is a schematic structural diagram of a clock frequency modulation apparatus according to another embodiment of the present invention.

Optionally, as another embodiment, the clock frequency modulation apparatus 30 may further include a first FIFO buffer 33 and a second FIFO buffer 34, as shown in FIG. 5.

The first FIFO buffer 33 is connected to the determining unit 31 and configured to perform first FIFO buffering on the first digital clock before the first digital clock is input to the determining unit 31.

The second FIFO buffer 34 is connected to the modulation unit 32 and configured to perform second FIFO buffering on the N digital clocks output by the modulation unit 32.

The second FIFO buffering is synchronous with the first FIFO buffering, so that the N digital clocks have no delay jitter after modulation.

In this way, a problem, caused by clock frequency jitter, of signal delay jitter and an error in interconnection between non-modulation clock domains can be solved.

It can be understood that the clock frequency modulation apparatus 30 can be implemented in a form of a chip or another circuit form; however, this embodiment of the present invention does not limit the specific implementation manner of the clock frequency modulation apparatus 30.

Figure 6:
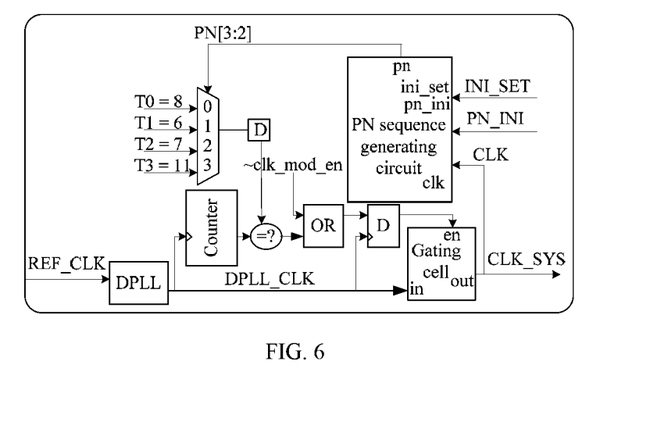
FIG. 6 shows a specific implementation circuit of a clock frequency modulation apparatus.

For ease of understanding, the following describes, with reference to FIG. 6, an example of a specific implementation circuit, such as a dynamic gating (Gating) circuit for clock frequency modulation, of the clock frequency modulation apparatus 30.

In FIG. 6, implementation of a PN4 algorithm in the embodiment with specific numerical values in FIG. 2 is still used as an example for description, that is, four digital clocks 163.84 MHz (which is a frequency obtained by dividing 983.04 MHz by 6), 140.43 MHz (which is a frequency obtained by dividing 983.04 MHz by 7), 122.88 MHz (which is a frequency obtained by dividing 983.04 MHz by 8), and 89.37 MHz (which is a frequency obtained by dividing 983.04 MHz by 11) are selected to fit into a periodical center-point digital clock.

The clock gating circuit includes a digital phase locked loop DPLL (Digital Phase Locked Loop) circuit, a counter (Counter), a gating cell (Gating Cell), a D flip-flop, an OR gate OR, a PN sequence generating circuit PN GEN, a selector, a comparator (=?), and the like.

The gating cell in FIG. 6 may implement a main function of the determining unit 31 in FIG. 3, and the PN sequence generating circuit, the selector, the D flip-flop, the counter, the comparator, the OR gate, the gating cell, and the like in FIG. 6 can implement a main function of the modulation unit 32 in FIG. 3, where the PN sequence generating circuit, the selector, and the like in FIG. 6 can implement a main function of the mapping subunit 321 in FIG. 4, and the gating cell and the like can implement a main function of the fitting subunit 322 in FIG. 4.

Specifically, in FIG. 6, after being input to the DPLL circuit, a reference clock (REF_CLK) signal becomes a DPLL_CLK signal, where the DPLL_CLK signal is a high-frequency clock signal and used as an example of the foregoing first digital clock signal. The counter uses the DPLL_CLK signal as triggered input for counting, and outputs a counting result.

A PN sequence generated by the PN sequence generating circuit is input to the selector, and input of the selector is a dividing coefficient (that is, frequency ratios of the first digital clock signal to each signal of the N digital clocks) of a low-frequency digital clock used for fitting. In the example of FIG. 6, four frequency ratios are 8, 6, 7, and 11, which are corresponding to the digital clocks A2 (A2=B), A0, A1 and A3 in FIG. 2, respectively. A result that is obtained after output of the selector is processed by the D flip-flop is compared with a counting result output by the counter. If the two results are the same, a comparison result is input to the OR gate, and other input of the OR gate is a ~clk_mod_en signal. The ~clk_mod_en signal is an enabling signal for the clock frequency modulation. Output of the OR gate is used as input of the D flip-flop, the triggered input of the D flip-flop is a DPLL_CLK signal, the result obtained by the D flip-flop is output to the gating cell (en). The result obtained by the D flip-flop is an clock input enabling signal, for example, when en is 0, it indicates that a current clock edge is not output; when en is 1, it indicates that the current clock edge is output. In addition, the DPLL_CLK signal is also used as other input (in) of the gating cell, where a clock system CLK SYS signal output (out) by the gating cell is used as a clock input signal CLK of the PN GEN circuit. Under joint effects of signals INI_SET, PN_INI, CLK, and the like, the PN GEN circuit generates a PN sequence. The PN sequence is provided to the selector, so that the selector can improve randomicity of the four frequencies 163.84 MHz (which is a frequency obtained by dividing 983.04 MHz by 6), 140.43 MHz (which is a frequency obtained by dividing 983.04 MHz by 7), 122.88 MHz (which is a frequency obtained by dividing 983.04 MHz by 8), and 89.37 MHz (which is a frequency obtained by dividing 983.04 MHz by 11). Herein, the INI_SET signal is a command for setting an initial value of a PN, and the PN_INI signal is an initial value (a seed) of the PN.

In a circuit in FIG. 6, clock frequency modulation needs to use a PN sequence to randomize jitter of a clock frequency to a greatest extent after frequency modulation, so as to obtain a better interference suppression effect. The PN sequence generating circuit PN GEN corresponding to the PN 4 algorithm used in this specific embodiment is shown in FIG. 7.

Figure 7:
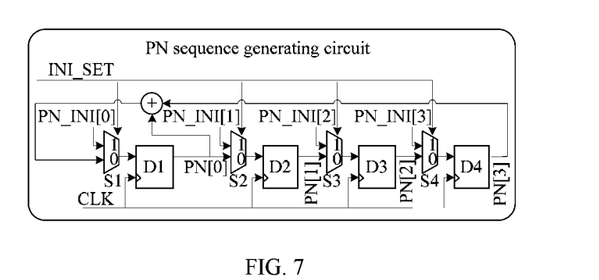
FIG. 7 shows a specific implementation circuit of a pseudo-random sequence generating circuit.

FIG. 7 is an example of the PN generating (PN GEN) circuit shown in FIG. 6. The PN generating circuit in FIG. 7 shows a structural diagram of performing periodic frequency fitting of the four frequencies, that is, the algorithm applied to PN 4. The PN generating circuit includes four pairs of selectors and D flip-flops, where each pair of selector and D flip-flop are connected in series with each other and forms a loop (Loop) by using a summator. In addition, in each pair of selector and D flip-flop, output of the selector is used as input of the D flip-flop. It is easy to understand that a structure of the PN GEN circuit is not unique, and a quantity of pairs of selector and D flip-flop may be changed according to a quantity of required corresponding frequencies. For example, if a modulated interfering harmonic clock frequency corresponding to periodic fitting of eight frequencies needs to be generated, eight pairs of selectors and D flip-flops may be set.

Before the circuit shown in FIG. 7 starts to work, an INI_SET signal is used to perform initial setting on four selectors (that is, a first selector S1, a second selector S2, a third selector S3, and a fourth selector). Output of the first selector S1 after PN_INI [0] is input enters a first flip-flop D1, and the first flip-flop D1 outputs PN [0] under triggering of a clock signal CLK. Afterward, output of the second selector S2 after PN [0] and PN_INI [1] are input enters a second flip-flop D2, and the second flip-flop D2 outputs PN [1] under triggering of the clock signal CLK. Afterward, output of a third selector S3 after PN [1] and PN_INI [2] are input enters a third flip-flop D3, and the third flip-flop D3 outputs PN [2] under triggering of the clock signal CLK. Afterward, output of a fourth selector S4 after PN and PN_INI [3] are input enters a fourth flip-flop D4, and the fourth selector D4 outputs PN [3] under triggering of the clock signal CLK. A result obtained when PN [3] and PN [0] are added by a summator is input together with PN_INI [0] to the first selector S1, and this is circulated repeatedly. Herein, the INI_SET signal is a command for setting an initial value of a PN, the PN_INI signal is an initial value (a seed) of a PN, and the PN signal is output of a PN sequence.

Figure 8:
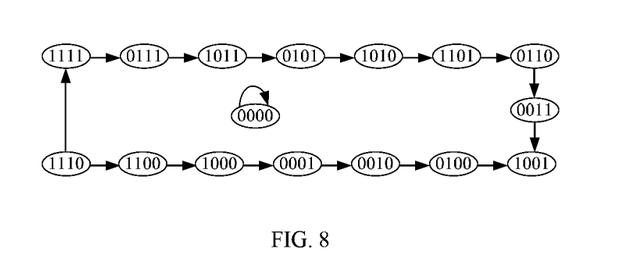
FIG. 8 shows a diagram of state transfer of a PN sequence generated by a pseudo-random sequence generating circuit.

FIG. 8 shows a diagram of state transfer of a PN sequence that may be generated by a PN GEN circuit, where 15 cyclic states and a dead state "0000" are included.

Generally, a longer PN sequence has better randomicity, but a longer PN sequence requires a longer period of frequency fitting, and a frequency difference becomes greater after it accumulates for some time, which results in more resources required before and after FIFO. Therefore, a PN sequence of a proper length may be selected in combination with randomicity that needs to be achieved.

Figure 9:
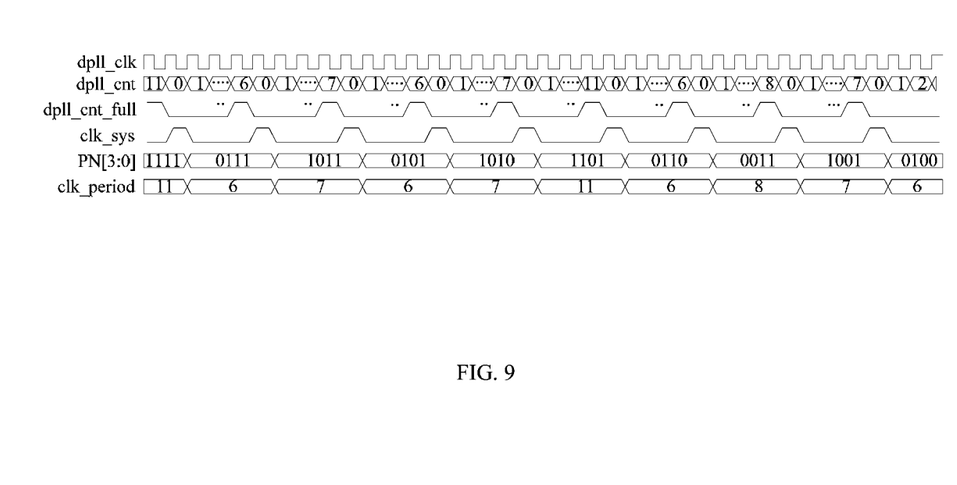
FIG. 9 shows a diagram of a correspondence between a pseudo-random sequence and clock frequency.

In addition, if a length of the PN sequence is m, only a maximum of $2^M$-1 frequencies can be selected for clock frequency modulation. Furthermore, when the PN sequence is not mapped in a one-to-one manner to the clock frequencies (if there are 15 frequencies, one-to-one mapping can be implemented; otherwise, only a part of the sequence is selected for mapping, where in an optional embodiment, two significant bits are selected from a 4-bit PN code as the PN sequence, as shown in FIG. 9), because a quantity of cyclic states is not $2^M$, it is preferable to map a non-modulated frequency (which is, for example, 122.88 MHz in this specific embodiment) to a dead state (that is "0000"); otherwise, probabilities that the modulated frequencies appear are inconsistent, and periodic frequency fitting cannot be implemented.

In this way, in this specific embodiment, frequency modulation and periodic frequency fitting are achieved by using a dynamic clock gating (Clock Gating) circuit.

However, clock frequency jitter may bring about the following problems:

1) Signal delay jitter. Radio communications is relatively sensitive to experimental certainty, so it is required that there is no signal delay jitter from the external perspective.

2) Error in interconnection to a non-modulation clock domain. Another circuit or another part of circuits of the ROC may not use a modulated clock frequency, which, if not handled, may cause an interconnection error and affect a normal function.

Figure 10:
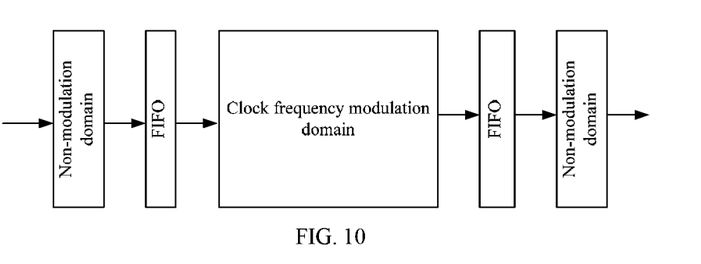
FIG. 10 shows a schematic diagram of a clock frequency modulation apparatus according to an embodiment of the present invention.

For clock frequency modulation, although jitter of a clock frequency is random in a relatively short period, it is even in a long period of time. Therefore, this specific embodiment may further use synchronous FIFO for buffering, so as to absorb this kind of periodic frequency jitter, so that the two foregoing problems can be avoided. A specific circuit structure is shown in FIG. 10.

By analyzing a diagram of state transfer, it can be known that, an under rate accumulates a maximum of 9 PLL clocks (89.37 MHz may appear 3 consecutive times), and an over rate accumulates a maximum of 9 PLL clocks, where 8 PLL clocks are a 122.88 MHz period, and 9 PLL clocks are corresponding to two 122.88 MHz periods. Therefore, theoretically, a depth of FIFO is 4, and a jitter absorbing function can be realized by setting a waterline in the middle. However, considering that an exception or soft implementation may occur, the depth and waterline of the FIFO are doubled, and the depth of the FIFO is defined as 8.

Figure 11:
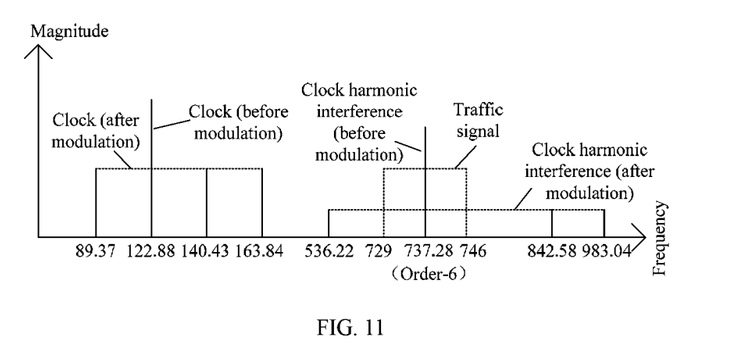
FIG. 11 shows a diagram of an implementation effect of a clock frequency modulation method according to an embodiment of the present invention.

FIG. 11 shows a diagram of an effect of using the clock frequency modulation method according to the embodiment of the present invention. For example, an order-6 interfering harmonic falls in a signal band (Band 12). In this specific embodiment, though there are only four discrete clock frequencies, effective digital-analog interference suppression is achieved. It is easy for a person skilled in the art to understand that if more effective digital-analog interference suppression is expected to be achieved, the number of frequencies may be increased, and a length of a PN sequence can be enlarged.

A person skilled in the art should understand that the clock frequency modulation apparatus 30 according to this embodiment of the present invention is not necessarily only implemented by the clock gating cell circuit in the specific embodiment, and the PN sequence generating circuit is not just as shown in FIG. 7. Any circuit that can implement randomicity required in periodic frequency fitting and spread spectrum may be used to implement the clock frequency modulation apparatus 30 in this embodiment of the present invention.

It should be understood that the solution described in each claim of the present invention should also be considered an embodiment, and the features in the claims may be combined. For example, different tributary steps executed after a step of determining may serve as different embodiments.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division, and there may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or a part of the technical solutions may be implemented in a form of a software product. The software product is stored in a storage medium, and includes several instructions for instructing a computer device (which may be a personal computer, a server, or a network device) to perform all or a part of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A clock frequency modulation method, comprising:
   determining, by a clock frequency modulation apparatus, N digital clocks according to a first digital clock of a system, wherein the N digital clocks comprise a second digital clock and N-1 digital clocks except the second digital clock, and a sum of frequency ratios of the first digital clock and each of the N-1 digital clocks is equal to N-1 times a frequency ratio of the first and second digital clocks, wherein N is an integer greater than 2, and wherein each of the N digital clocks is an integer frequency dividing clock of the first digital clock and frequency dividing coefficients of the N digital clocks are different from each other; and fitting, by the apparatus, the first digital clock into the second digital clock during a modulation period using the N digital clocks.

2. The method according to claim 1, wherein fitting the first digital clock into the periodic second digital clock further comprises:

mapping, during the modulation period, the N digital clocks separately to a pseudo-random noise (PN) sequence with a length of M, so as to randomize frequency jitter of the N digital clocks, wherein a probability that each of the N digital clocks appears in the modulation period is equal, a cyclic period of the PN sequence is equal to the modulation period, N is less than or equal to $2^M$, and M is a positive integer; and fitting the first digital clock into the second digital clock during the modulation period using the N digital clocks mapped to the PN sequence.

3. The method according to claim 2, wherein mapping the N digital clocks separately to the PN sequence with the length of M further comprises:

mapping, when N is equal to $2^M$, the N-1 digital clocks to $2^M$-1 cyclic states of the PN sequence in a one-to-one manner, and mapping the second digital clock to a dead state of the PN sequence, wherein the dead state is a PN code whose M bits are all 0s, and other PN codes are the cyclic states.

4. The method according to claim 2, wherein mapping the N digital clocks separately to the PN sequence with a length of M further comprises:

selecting, when N is equal to $2^L$ and L is a positive integer less than M, L bits from M bits of the PN sequence;

mapping the second digital clock to a PN code, which is in the PN sequence, with the L bits whose numerical values are all 0s; and mapping the N-1 digital clocks to other PN codes of the PN sequence, wherein any of the digital clocks is separately mapped to a plurality of PN codes with the L bits whose numerical values are the same.

5. The method according to claim 1, wherein before determining the N digital clocks according to the first digital clock of the system, the method further comprises:

performing first FIFO (first-in first-out) buffering on the first digital clock; and performing second FIFO buffering on the N digital clocks after fitting the first digital clock into the second digital clock using the N digital clocks, wherein the second FIFO buffering is synchronous with the first FIFO buffering, so that the N digital clocks have no delay jitter after modulation.

6. A clock frequency modulation apparatus comprising:

a determining circuit configured to determine N digital clocks according to a first digital clock of a system, wherein the N digital clocks comprise a second digital clock and N-1 digital clocks except the second digital clock, and a sum of frequency ratios of the first digital clock and each of the N-1 digital clocks is equal to N-1 times a frequency ratio of the first and second digital clocks, wherein N is an integer greater than 2, and wherein each of the N digital clocks is an integer frequency dividing clocks of the first digital clock and frequency dividing coefficients of the N digital clocks are different from each other; and a modulator configured to fit the first digital clock into the second digital clock during a modulation period using the N digital clocks.

7. The apparatus according to claim 6, wherein the modulator comprises:

a mapping circuit, configured to map, during the modulation period, the N digital clocks separately to a pseudo-random noise (PN) sequence with a length of M, so as to randomize frequency jitter of the N digital clocks, wherein a probability that each of the N digital clocks appears in the modulation period is equal, a cyclic period of the PN sequence is equal to the modulation period, N is less than or equal to $2^M$, and M is a positive integer; and a fitting circuit configured to fit the first digital clock into the second digital clock during the modulation period by using the N digital clocks mapped to the PN sequence.

8. The apparatus according to claim 7, wherein the mapping circuit is configured to:

when N is equal to $2^M$, map the N-1 digital clocks to $2^M$-1 cyclic states of the PN sequence in a one-to-one manner, and map the second digital clock to a dead state of the PN sequence, wherein the dead state is a PN code whose M bits are all 0s, and other PN codes are the cyclic states.

9. The apparatus according to claim 7, wherein the circuit is configured to:

when N is equal to $2^L$ and L is a positive integer less than M, select L bits from M bits of the PN sequence, map the second digital clock to a PN code, which is in the PN sequence, with the L bits whose numerical values are all 0s, and map the N-1 digital clocks to other PN codes of the PN sequence, wherein any of the digital clocks is separately mapped to a plurality of PN codes with the L bits whose numerical values are the same.

10. The apparatus according to claim 6, further comprising:

a first FIFO (first-in first-out) buffer connected to the determining circuit and configured to perform first FIFO buffering on the first digital clock before the first digital clock is input to the determining circuit;

a second FIFO buffer connected to the modulator and configured to perform second FIFO buffering on the N digital clocks output by the modulator wherein the second FIFO buffering is synchronous with the first FIFO buffering, so that the N digital clocks have no delay jitter after modulation.

11. A clock frequency modulation apparatus comprising:

a determining circuit configured to determine N digital clocks according to a first digital clock of a system, wherein the N digital clocks comprise a second digital clock and N-1 digital clocks except the second digital clock, and a sum of frequency ratios of the first digital clock and each of the N-1 digital clocks is equal to N-1 times a frequency ratio of the first and second digital clocks, wherein N is an integer greater than 2;

a modulator configured to fit the first digital clock into the second digital clock during a modulation period using the N digital clocks;

a first FIFO (first-in first-out) buffer coupled to the determining circuit and configured to perform first FIFO buffering on the first digital clock before the first digital clock is input to the determining circuit;

a second FIFO buffer connected to the modulator and configured to perform second FIFO buffering on the N digital clocks output by the modulator; wherein the second FIFO buffering is synchronous with the first FIFO buffering, so that the N digital clocks have no delay jitter after modulation.

12. The apparatus according to claim 11, wherein when a probability that each of the N digital clocks appears in the modulation period is equal, a cyclic period of the PN sequence is equal to the modulation period, N is less than or equal to $2^M$ and M is a positive integer, the modulator comprises:
    a mapping circuit configured to map, during the modulation period, the N digital clocks separately to a pseudo-random noise (PN) sequence with a length of M, so as to randomize frequency jitter of the N digital clocks; and
    a fitting circuit configured to fit the first digital clock into the second digital clock during the modulation period by using the N digital clocks mapped to the PN sequence.

13. The apparatus according to claim 12, wherein when N is equal to $2^M$ the mapping circuit is configured to:
    map the N-1 digital clocks to $2^M$-1 cyclic states of the PN sequence in a one-to-one manner; and
    map the second digital clock to a dead state of the PN sequence,
    wherein the dead state is a PN code whose M bits are all 0s, and other PN codes are the cyclic states.

14. The apparatus according to claim 12, wherein when N is equal to $2^L$ and L is a positive integer less than M the mapping circuit is configured to:
    select L bits from M bits of the PN sequence;
    map the second digital clock to a PN code, which is in the PN sequence, with the L bits whose numerical values are all 0s; and
    map the N-1 digital clocks to other PN codes of the PN sequence,
    wherein any of the digital clocks is separately mapped to a plurality of PN codes with the L bits whose numerical values are the same.

* * * * *